US011527709B2

(12) United States Patent
Gupta et al.

(10) Patent No.: US 11,527,709 B2
(45) Date of Patent: Dec. 13, 2022

(54) SOT MULTIBIT MEMORY CELL

(71) Applicants: IMEC vzw, Leuven (BE); Katholieke Universiteit Leuven, Leuven (BE)

(72) Inventors: Mohit Gupta, Leuven (BE); Trong Huynh Bao, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 127 days.

(21) Appl. No.: 17/027,525

(22) Filed: Sep. 21, 2020

(65) Prior Publication Data
US 2021/0098694 A1 Apr. 1, 2021

(30) Foreign Application Priority Data

Sep. 26, 2019 (EP) ..................................... 19199882

(51) Int. Cl.
| | | |
|---|---|---|
| *H01L 43/08* | (2006.01) | |
| *G01R 33/09* | (2006.01) | |
| *G11C 11/16* | (2006.01) | |
| *H01L 43/02* | (2006.01) | |
| *H01L 43/10* | (2006.01) | |

(52) U.S. Cl.
CPC ............ *H01L 43/08* (2013.01); *G01R 33/098* (2013.01); *G11C 11/161* (2013.01); *G11C 11/1673* (2013.01); *G11C 11/1675* (2013.01); *H01L 43/02* (2013.01); *H01L 43/10* (2013.01)

(58) Field of Classification Search
CPC ......... H01L 43/08; H01L 43/02; H01L 43/10; G01R 33/098; G11C 11/161; G11C 11/1673; G11C 11/1675
USPC ......................................................... 257/421
See application file for complete search history.

(56) References Cited

U.S. PATENT DOCUMENTS

2015/0213867 A1* 7/2015 Wu ..................... G11C 11/1675
365/158

OTHER PUBLICATIONS

Kim, Yusung, et al., "Multilevel Spin-Orbit Torque MRMAs", IIEE Transactions on Electron Devices, IIEE Service Center, Piscataway, NJ, US vol. 62, No. 2, Jan. 20, 2015, pp. 561-568.
Extended European Search Report for counterpart application No. 19199882.2, dated Mar. 31, 2020.

* cited by examiner

*Primary Examiner* — Jami Valentine Miller
(74) *Attorney, Agent, or Firm* — Knobbe Martens Olson & Bear, LLP (57) ABSTRACT

The disclosed technology relates to a multibit memory cell. In one aspect, the multibit memory cell includes a plurality of spin-orbit torque (SOT) tracks, plurality of magnetic tunnel junctions (MTJs), an electrically conductive path connecting a first MTJ and a second MTJ together, and a plurality of terminals. The plurality of terminals can be configured to provide a first SOT write current to the first MTJ, a second SOT write current to the second MTJ, and at least one of: the second SOT write current to a third MTJ, a third SOT write current to the third MTJ, and a spin transfer torque (STT) write current through the third MTJ. The junction resistances of the various MTJs are such that a combined multibit memory state of the MTJs is readable by a read current through all the MTJs in series.

20 Claims, 2 Drawing Sheets

SOT MULTIBIT MEMORY CELL

CROSS-REFERENCE TO RELATED APPLICATIONS

This application claims foreign priority to European Application EP 19199882.2, filed on Sep. 26, 2019, which is incorporated herein by reference in its entirety.

BACKGROUND

Technological Field

The disclosed technology relates to the field of multibit memory cells, and more particularly, to a multibit memory cell storing data using a plurality of magnetic tunneling junctions operated by spin-orbit torque (SOT) currents provided in SOT tracks.

Description of the Related Technology

The use of programmable resistive elements, such as magnetic tunnel junctions (MTJs), has been proposed to provide non-volatile data storage. In MTJs, the magnetization orientation of the magnetic free layer with respect to that of the magnetic reference layer of the MTJ may be used to represent a binary state. For example, if the magnetization orientations in the two magnetic layers align (parallel state), the MTJ may be said to encode a logical "0". Likewise, if the magnetization orientations in the two magnetic layers do not align (antiparallel state), the MTJ may instead be said to encode a logical "1". The current state of the MTJ may be read out by passing a read current through the junction, and data may thus be stored in, and readable from, such an MTJ in a non-volatile fashion.

However, with the ongoing trend of miniaturization, there is a need for more efficient memory cells both in terms of energy consumption and area requirements.

SUMMARY OF CERTAIN INVENTIVE ASPECTS

To at least partly fulfill the above need, the present disclosure provides a multibit memory cell as defined in the independent claims. Further embodiments of the present disclosure are provided in the dependent claims.

One objective of some aspects of the disclosed technology is to provide a multibit memory cell. The multibit memory cell includes a plurality of spin-orbit torque (SOT) tracks. The plurality of SOT tracks includes at least a first SOT track and a second SOT track which is separate from the first SOT track. As used herein, "separate" is to be interpreted such that, if not including additional components, the first and second SOT tracks are not electrically connected. There may, for example, be an air-gap or similar separating the two tracks. In some embodiments, the two tracks may be fabricated as a single track, which is then formed into two separate parts, e.g., by lithographic processes or similar.

The multibit memory further includes a plurality of magnetic tunnel junctions (MTJs). The plurality of MTJs includes at least a first MTJ which is provided on the first SOT track. An MTJ may for example include a magnetic free layer and a magnetic reference (or pinned) layer separated by a non-magnetic intermediate (or barrier) layer. As used herein, that an MTJ is "provided on a SOT track" includes the MTJ being oriented such that the magnetic free layer is connected to the SOT track, such that a current passed in the SOT track (i.e. an "SOT write current") may alter the magnetic state (i.e. the direction of magnetization) in the magnetic free layer. The altered magnetic state (i.e. parallel or antiparallel) in the magnetic free layer may depend on the direction of the SOT write current passed in the SOT track. Generally, an MTJ is an example of a storage element that may be formed from two magnetic layers, such as ferromagnetic layers, separated by a tunneling (or barrier) layer. One of the two ferromagnetic layers, referred to as the fixed, pinned, or reference, layer may have a magnetization which is fixed in a particular direction. The other one of the two ferromagnetic layers, referred to as the free layer, may have a magnetization direction that can be altered to two different states. In one of such states, the magnetization directions/orientations of the two ferromagnetic layers align, and such a state is referred to as a parallel state. In the other one of such states, the magnetization directions of the two ferromagnetic layers may not align, and such a state may be referred to as an antiparallel, or non-parallel, state (although it is envisaged that the magnetization directions need not necessarily be completely antiparallel, but at least not aligned in the same direction as for the parallel state, and such that there is a difference in junction resistance between the two states). The different states of the free layer (with respect to the reference layer) may be used to represent either a logic "1" or a logic "0". In particular, the electrical resistance of an MTJ may depend on whether the magnetic orientations in the two layers are parallel or antiparallel. The parallel state may for example be associated with the logic "1", and the resistance in such a state may be lower compared with the antiparallel state. Accordingly, the antiparallel state may be associated with the logic "0". The MTJs may further be provided with an in-plane magnetic anisotropy or a perpendicular magnetic anisotropy (PMA). A read current may be passed through an MTJ, and used to detect the current junction resistance of the MTJ and thereby the current state (i.e. whether the MTJ currently stores a logic "1" or "0").

The plurality of MTJs further includes a second MTJ and a third MTJ provided on the second SOT track. The multibit memory further includes an electrically conductive path which connects the first MTJ and the second MTJ together. The electrically conductive path may for example extend between the magnetic reference layers of the first and second MTJs, such that a current may pass through both the first MTJ and the second MTJ even though the first SOT track and the second SOT track are separated from each other.

The multibit memory further includes terminals, or current injection means, for providing a first SOT write current for the first MTJ in the first SOT track, a second SOT write current for the second MTJ in the second SOT track, and at least one of: the second SOT write current for the third MTJ in the second track, a third SOT write current for the third MTJ in the second SOT track, and a spin transfer torque (STT) write current through the third MTJ. Here, the STT write current passed through the third MTJ may be used to change the magnetic orientation in the magnetic free layer of the third MTJ, such that the magnetic orientations in the magnetic free layer and in the magnetic reference layer of the third MTJ are either parallel or antiparallel. There may be two terminals connected to the first SOT track and configured to pass/inject an SOT write current at least in proximity of the magnetic free layer of the first MTJ. There may be two terminals connected to the second SOT track and configured to pass/inject an SOT write current at least in proximity of the magnetic free layer of the second MTJ. This latter SOT write current may, or may not, further pass in proximity of the magnetic free layer of the third MTJ. There may be a terminal connected to the third MTJ (i.e. to the magnetic reference layer of the third MTJ), such that an STT write current may be passed through the third MTJ. Alternatively, there may be a third terminal connected between the second MTJ and the third MTJ in the second SOT track, such that, using the other two terminals of the second SOT track, individual SOT write currents may be passed in proximity of the (magnetic free layers of the) second MTJ and the third MTJ, respectively. The exact envisaged configurations of the various terminals will be described in more detail later with reference to the accompanying drawings.

In the multibit memory cell, the respective junction resistances of the plurality of MTJs (i.e. the first MTJ, the second MTJ, and the third MTJ) are such that a combined multibit memory state (representing a stored multibit value) of the plurality of MTJs is readable by a read current. The read current may pass through all of the plurality of MTJs, via the electrically conductive path (i.e. through the first MTJ, on to and through the second MTJ via the electrically conductive path, and then on to and through the third MTJ via the second SOT track, or the other way around). Phrased differently, the read current may be passed in series through the plurality of MTJs, via the electrically conductive path which connects the first MTJ and second MTJ together, even though the first SOT track and the second SOT track are separated. As used herein, with "respective junction resistances" is meant the respective parallel and antiparallel junction resistances of the corresponding MTJs, respectively.

As indicated in Table 1, eight combinations of total junction resistance values are possible using three MTJs. In Table 1, $R_3$ is the junction resistance for the j:th MTJ (where j=1 for the first MTJ, j=2 for the second MTJ, and j=3 for the third MTJ). If the j:th MTJ is in a parallel state, $R_3=R_{pj}$, where $R_{pj}$ is the parallel junction resistance for the j:th MTJ. If the j:th MTJ is in an antiparallel state, $R_3=R_{apj}$, where $R_{apj}$ is the antiparallel junction resistance for the j:th MTJ. The read current passed (in series) through the plurality of MTJs will therefore face a total junction resistance $R_{tot}$, which is the sum of the junction resistances for all MTJs (i.e. $R_{tot}=R_1+R_2+R_3$, if using three MTJs).

TABLE 1

Junction resistance combinations for three MTJs.

| $R_1$ | $R_2$ | $R_3$ | $R_{tot}$ |
|---|---|---|---|
| $R_{p1}$ | $R_{p2}$ | $R_{p3}$ | $R_{p1} + R_{p2} + R_{p3}$ |
| $R_{p1}$ | $R_{p2}$ | $R_{ap3}$ | $R_{p1} + R_{p2} + R_{ap3}$ |
| $R_{p1}$ | $R_{ap2}$ | $R_{p3}$ | $R_{p1} + R_{ap2} + R_{p3}$ |
| $R_{p1}$ | $R_{ap2}$ | $R_{ap3}$ | $R_{p1} + R_{ap2} + R_{ap3}$ |
| $R_{ap1}$ | $R_{p2}$ | $R_{p3}$ | $R_{ap1} + R_{p2} + R_{p3}$ |
| $R_{ap1}$ | $R_{p2}$ | $R_{ap3}$ | $R_{ap1} + R_{p2} + R_{ap3}$ |
| $R_{ap1}$ | $R_{ap2}$ | $R_{p3}$ | $R_{ap1} + R_{ap2} + R_{p3}$ |
| $R_{ap1}$ | $R_{ap2}$ | $R_{ap3}$ | $R_{ap1} + R_{ap2} + R_{ap3}$ |

In some embodiments, the respective junction resistances of the plurality of MTJs (i.e. $R_{p1}$, $R_{ap1}$, $R_{p2}$, $R_{ap2}$, $R_{p3}$ and $R_{ap3}$) are selected such that at least three, or at least four, of the possible total resistance combinations are different, such that more than a single bit (i.e. a multibit state) may be represented by, stored in, and read out from the plurality of MTJs using the read current.

The read current passed through all the MTJs may for example be injected by applying a potential difference (using the various terminals) across all of the (series connected) MTJs, and the total resistance ($R_{tot}$) of all MTJs may be extracted by measuring the size of the read current (i.e. by using Ohm's law), or similar. The measured total resistance of all MTJs may correspond to the multibit value stored in the multibit memory cell.

For memory cells in general, a read energy may include the DC current energy needed to develop a read voltage and bitline (BL) energy. One non-limiting advantage of the multibit memory cell as disclosed herein is that it requires only a single bitline for multibit memory. This allows for the BL energy to be reduced as reading only through a single bitline is required, compared to conventional memory cells where reading through three bitlines is required when each cell is read separately. Similarly, the DC current may further be reduced which reduces an overall energy consumption even more. The multibit memory cell as disclosed herein may further provide a reduced area requirement as terminals are shared, including an improvement with regards to parasitics. In addition, the multibit memory cell may allow for separate RWL and WL lines, as compared to using three separate single SOT cells, thus allowing for a reduced capacitance.

In some embodiments, the multibit memory cell may be such that the plurality of SOT tracks further includes a third SOT track which is separate from both the first SOT track and the second SOT track. The multibit memory cell may further be such that the plurality of MTJs includes a fourth MTJ and a fifth MTJ both provided on the third SOT track. The multibit memory may include a second electrically conductive path, connecting the third MTJ and the fourth MTJ together. The multibit memory cell may include further terminals, configured to provide a fourth SOT write current for the fourth MTJ in the third SOT track, and at least one of: the fourth SOT write current for the fifth MTJ in the third SOT track, a fifth SOT write current for the fifth MTJ in the third SOT track, and a second STT write current through the fifth MTJ. Respective junction resistances for the plurality of MTJs (i.e. the first MTJ, the second MTJ, the third MTJ, the fourth MTJ, and the fifth MTJ) may be such that a combined multibit memory state of the plurality of MTJs is readable be a read current passed (in series) through the plurality of MTJs via the electrically conductive path and the second electrically conductive path.

Including additional SOT tracks and MTJs may increase the number of bits in the multibit memory cell, and Table 1 may be expanded accordingly to include $R_4$ and $R_5$ (and the corresponding resistances $R_{a4}$, $R_{a5}$, $R_{ap4}$, $R_{ap5}$), leading to an enlarged number of possible $R_{tot}$ combinations and thus for an increased number of bits/values storable in, and readable from, the multibit memory cell.

In some embodiments, the junction resistances of the plurality of MTJs (i.e. the first MTJ, the second MTJ, and the third MTJ) may all be different. As used herein, "all different" means that the resistances are such that all $R_{tot}$ combinations as provided in Table 1 are different. Using different junction resistances (both parallel and antiparallel) may for example maximize the number of different values storable in, and readable from, the multibit memory.

In some embodiments, the junction resistances of the plurality of MTJs may be selected such that they equal a same constant value times a power of two. For example, the junction resistances (both parallel and antiparallel) may be selected such that each $R_{tot}$ combination equals a same constant value times a power of two. Such an exponential difference between the various junction resistances may for example enhance a sensing margin among different states/stored values. An exponential difference in junction resistance between different MTJs may be achieved by varying the critical dimension (CD) of each MTJ exponentially. Even if the CD's of different MTJs may not, for manufacturing reasons, be made to vary exactly exponentially, the CDs may at least be varied such that the resistances between different MTJs are different, and such that, due to the MTJs being connected in series, the combined series resistance changes with different stored bit states in a way such that two different bit states may be detected.

In some embodiments, the junction resistances of the plurality of MTJs may all be equal, i.e. such that all parallel resistances $R_{pj}$ are equal and such that all antiparallel resistances $R_{apj}$ are equal (but still such that $R_{pj}$ does not equal $R_{apj}$). Although the total number of different values storable in such a multibit memory cell may be lower than if the MTJs have different junction resistances, using equal junction resistances may provide other benefits in terms of a needed number of different terminals connecting to the various SOT tracks, etc. For example, all $R_{tot}$ combinations including one parallel resistance and two antiparallel resistances may correspond to a first value, all $R_{tot}$ combinations including two parallel resistances and one antiparallel resistance may correspond to a second value, all $R_{tot}$ combinations including three parallel resistances and zero antiparallel resistances may correspond to a third value, and all $R_{tot}$ combinations including zero parallel resistances and three antiparallel resistances may correspond to a fourth value, thus providing for storage of a total number of four different values in the multibit memory cell as disclosed herein.

The present disclosure relates to all possible combinations of features recited in the claims. Further objects and advantages of the various embodiments of the present disclosure will be described below by means of exemplifying embodiments.

BRIEF DESCRIPTION OF THE DRAWINGS

Exemplifying embodiments will be described below with reference to the accompanying drawings, in which.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the FIGURES, the sizes of elements and regions may not necessarily be drawn to scale and may be exaggerated for illustrative purposes and, thus, are provided to illustrate the general structures of the embodiments.

DETAILED DESCRIPTION OF CERTAIN ILLUSTRATIVE EMBODIMENTS

Exemplifying embodiments will now be described more fully hereinafter with reference to the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the present disclosure to the skilled person.

With reference to FIGS. 1A to 1D, various embodiments of a multibit memory cell according to the disclosed technology will now be described in more detail.

Figure 1A:
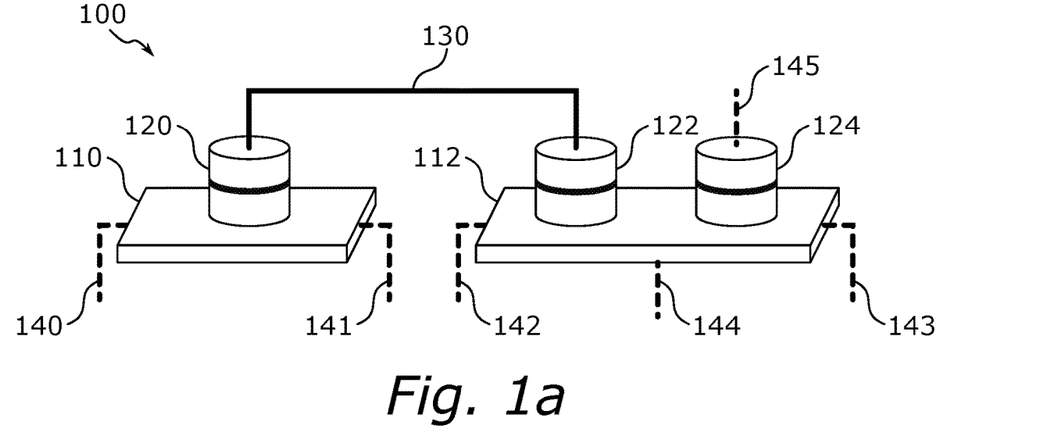
FIG. 1A illustrates schematically various embodiments of a multibit memory cell according to the disclosed technology.

FIG. 1A illustrates schematically a multibit memory cell 100. The multibit memory cell (hereinafter just "the cell") 100 includes a plurality of SOT tracks, including a first SOT track 110 and a second SOT track 112. The first SOT track 110 and the second SOT track 112 are separated from each other, such that they are electrically disconnected (i.e. such that no current may flow between them) if there are no other electrical components and/or connections provided thereon or therebetween. As used herein, a "SOT track" may consist of, or include at least one layer of, an electrically conducting material presenting a relatively large spin-orbit coupling. The SOT track may for example be non-magnetic, and example materials for the SOT track may include metals such as Ta, W, Pt, Pd, Ir, IrMn, PtMn, W, WOx, WN, W(O,N), AuPt, Hf, PtHf, FeMn, NiMn or topological insulators such as BixSe1-x, BixSb1-x, (Bi,Sb)2Te3 or transition metal dichalcogenide (TMD) such as MoS2, WTe2. The SOT track may have a multi-layer structure, e.g., including a combination of any of the above-mentioned materials.

A first MTJ 120 is provided on the first SOT track 110. As used herein, an MTJ (such as the MTJ 120) is considered as consisting of three layers, i.e. a bottom layer connected to a SOT track (such as the SOT track 110), an intermediate layer (shown in black in the FIGURES), and a top layer on the side of the intermediate layer not facing the SOT track. In some embodiments, the bottom layer is a magnetic free layer, the top layer is a magnetic reference layer, and the intermediate layer is a non-magnetic barrier layer. In the magnetic reference layer, the direction of the magnetization (i.e. the combined spin-alignment) may be pinned in a certain direction. Depending on the direction of the magnetization in the magnetic free layer, electrons may tunnel through the barrier layer with lower or higher difficulty, such that a resistance of the MTJ will depend on whether the direction of magnetization in the magnetic free layer aligns or does not align with that of the magnetic reference layer. If the magnetization directions align, the junction resistance of the MTJ will be lower, and if the magnetization directions do not align, the junction resistance of the MTJ will be higher. The exact resistances in the two states may be tailored by adapting the critical dimension(s) of the MTJ. In alternative embodiments, an MTJ may include additional layers, and/or each layer may itself be a layer structure consisting of multiple sublayers. In some embodiments, the exact configuration of an MTJ may vary as long as there is a magnetic free layer (or layer structure), a magnetic reference layer (or layer structure), and an intermediate non-magnetic barrier layer separating the magnetic free and reference layers (or layer structures), and as long as the above described functionality of the MTJ is preserved.

A second MTJ 122 and a third MTJ 124 are provided on the second SOT track 112. The cell 100 further includes an electrically conductive path 130 (which may be, e.g., a metallic wire, a metallic track, or similar). The path 130 connects the first MTJ 120 and the second MTJ 122 together. With the help of the first SOT track 110, the second SOT track 112, and the path 130, the first MTJ 120, the second MTJ 122, and the third MTJ 124 are connected in series, such that a current sent through one junction may pass on to another junction, and so on. The first MTJ 120, the second MTJ 122 and the third MTJ 124 form part of a plurality of MTJs included in the cell 100.

The cell 100 further includes two terminals 140 and 141 which are connected to the first SOT track 110. With the help of the terminals 140 and 141, a current may be injected through (or in) the first SOT track 110, and in the proximity of the (magnetic free layer of the) first MTJ 120.

The cell 100 further includes a plurality of terminals connected to the second SOT track 112. In FIG. 1A, there is illustrated three terminals 142, 143, and 144 connected to the second SOT track 112. In some embodiments, some of the terminals 142, 143, and 144 are optional depending on the operating mode of the cell 100. If both included, the terminals 142 and 143 may be used to inject a current through (or in) the second SOT track 112 that will pass in the proximity of both the (magnetic free layers of both the) second MTJ 122 and the third MTJ 124. If both included, the terminals 142 and 144 may be used to inject a current through (or in) the second SOT track 112 that will pass in the proximity of only the (magnetic free layer of the) second MTJ 122. Similarly, if both included, the terminals 143 and 144 may be used to inject a current through (or in) the second SOT track 112 that will pass in the proximity of only the (magnetic free layer of the) third MTJ 124.

The cell 100 further includes a terminal 145 connected to (the magnetic reference layer of the) third MTJ 124. Depending on the operating mode of the cell 100, the terminal 145 may be optional, as will also be described further below. As used herein, a "terminal" is an electrical access which allows current to be injected into a piece of material (or a material structure, such as an SOT track or an MTJ) to which the terminal is connected. A terminal may for example be a metallic wire, a metallic path/track, a VIA, or similar.

Figure 1B:
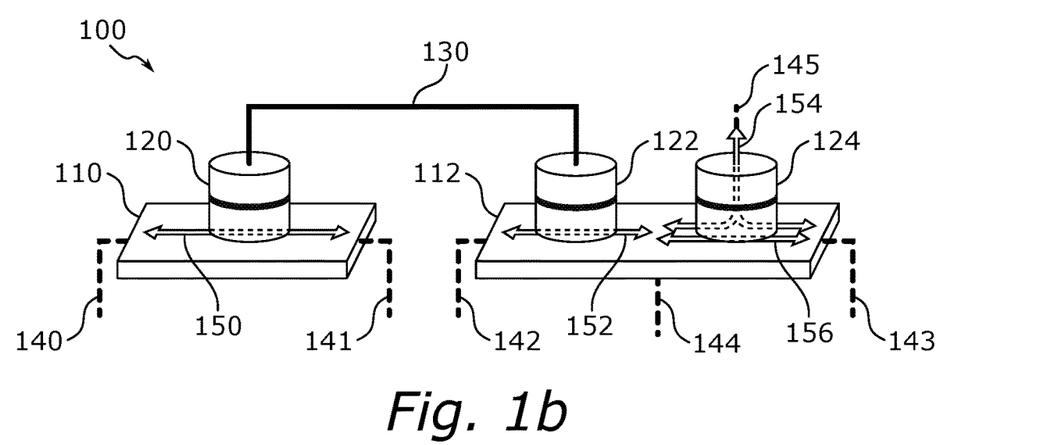
FIG. 1B illustrates schematically various write currents for the multibit memory cell of FIG. 1A.

FIG. 1B illustrates schematically various operating modes of writing to the cell 100. The two terminals 140 and 141 may be used to inject a SOT write current (as illustrated by the arrow 150 in FIG. 1B) in the first SOT track 110. As illustrated in FIG. 1B, the SOT write current 150 passes in the proximity of the magnetic free layer of the first MTJ 120. Depending on the direction of the current 150, the magnetization direction in the magnetic free layer of the first MTJ 120 may be changed such that it either aligns or does not align with that of the magnetic reference layer of the first MTJ 120. For example, injecting a current from the terminal 140 to the terminal 141 may put the first MTJ 120 in a first state, while injecting a current in the other direction, i.e. from the terminal 141 to the terminal 140, may put the first MTJ 120 in a second state, wherein the junction resistance of the first MTJ 120 is different in the first and second states, as described earlier.

To inject a corresponding SOT write current in the proximity of the second MTJ 122 (i.e. to control the state of the second MTJ 122), various configurations of terminals may be used. In one configuration, the cell 100 may include the terminals 142 and 144. A current injected between the terminals 142 and 144 will then only pass in the proximity of the second MTJ 122 (but not in the proximity of the third MTJ 124). Such a current is illustrated by the arrow 152 in FIG. 1B. The current 152 may thus act as an SOT write current for the first MTJ 120. In another configuration, the cell 100 may instead include the terminals 142 and 143, such that the injected current (not shown in FIG. 1B) will pass in the proximities of both the second MTJ 122 and the third MTJ 124. Such a current may thus act as an SOT write current for both the second MTJ 122 and the third MTJ 124.

To write to the third MTJ 124, various configurations of terminals are envisaged. As described above, if including the terminals 142 and 143, the same SOT write current (not shown) may be used to write to both the second MTJ 122 and the third MTJ 124. This may be useful if the junction resistances of the second MTJ 121 and the third MTJ 124 are equal. In another configuration, the cell 100 may include all the terminals 142, 143, and 144. In such a configuration, terminals 142 and 144 may be used to provide one SOT write current 152 for the second MTJ 122, and terminals 143 and 144 may be used to provide another SOT write current (as illustrated by the arrow 156 in FIG. 1B) for the third MTJ 124. Such a configuration may be useful if the junction resistances of the second MTJ 122 and the third MTJ 124 are different. In yet another configuration of the cell 100, the state of the third junction 124 may instead be controlled by using an STT write current (as illustrated by the arrow 154 in FIG. 1B), which instead of passing only in the proximity of the magnetic free layer of the MTJ passes through the MTJ. In such a configuration, a terminal 145 may be provided, and either of the terminals 142, 143 and 144 (depending on which of these terminals are included) may be used together with the terminal 145 to inject the STT write current 154 through the third MTJ 124. Here, even if the terminals 142 and 143 were to be used to inject the SOT write current 152 through the second MTJ 122, the state of the third MTJ 124 could be individually controlled by, e.g., passing the STT write current 154 after the second MTJ 122 has been written to by the current 152. In summary, several embodiments are envisaged, wherein the configuration and inclusion of the various terminals 142, 143, 144, and 145 for writing to the cell 100 vary depending on the wanted write currents. One embodiment may include only the terminals 142 and 143 for writing to the cell 100. One embodiment may include only the terminals 142, 143, and 144 for writing to the cell 100. One embodiment may include only the terminals 142, 143, and 145 for writing to the cell 100. One embodiment may include only the terminals 142, 144, and 145 for writing to the cell 100. One embodiment may include all the terminals 142, 143, 144, and 145 for writing to the cell 100. Etc.

Figure 1C:
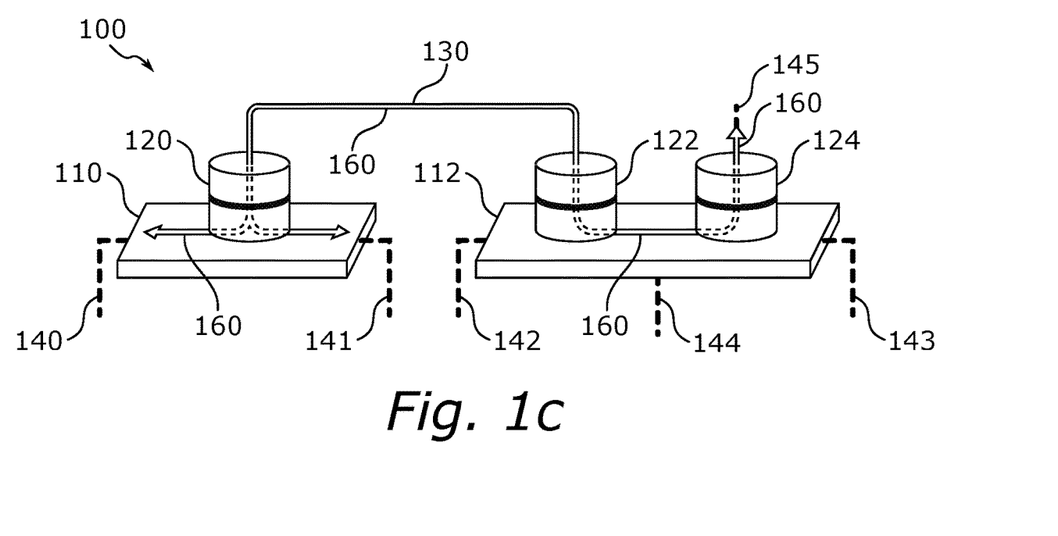
FIG. 1C illustrates schematically a read current for the multibit memory cell of FIG. 1A.

FIG. 1C illustrates schematically how to read from the cell 100. The first MTJ 120, the second MTJ 122, and the third MTJ 124 are connected in series, and a read current (as illustrated by the arrow 160 in FIG. 1C) may be passed through all of the first MTJ 120, the electrically conductive path 130, the second MTJ 122, and the third MTJ 124 in order to measure the combined series junction resistance of the MTJs 120, 122, and 124. As illustrated in FIG. 1C, the read current 160 may for example be injected using the terminal 145 and any one (or both) of the terminals 140 and 141.

The functioning of reading/writing to the cell 100 will now be described in more detail. As described earlier, the junction resistances of the various MTJs may be configured such that the combined multibit state of the cell 100 may be both written and read by using various currents injected into the various SOT tracks and MTJs. In some embodiments, an MTJ may have two possible junction resistances, depending on whether the direction of magnetization in the magnetic free and reference layers align or not. If both directions of magnetization align, an MTJ may be said to be in a parallel state. If the directions of magnetization do not align, the MTJ may be said to be in an antiparallel state. The junction resistance ($R_j$) in the parallel state ($R_{pj}$) may be lower than in the antiparallel state ($R_{apj}$). By passing a read current through the MTJ, the state of the MTJ may be detected by measuring the junction resistance. For multiple MTJs connected in series, the combined state of all MTJs may be detected by measuring the total series junction resistance ($R_{tot}=R_1+R_2+R_3$).

Using a cell having three series-connected MTJs ($MTJ_1$, $MTJ_2$, and $MTJ_3$; each having junction resistances $R_{p1}$, $R_{p2}$, and $R_{p3}$ in their parallel states, and junction resistances $R_{ap1}$, $R_{ap2}$, and $R_{ap3}$ in their antiparallel states, respectively), as an example, the combined state of all MTJs may be represented by the combined series junction resistance $R_{tot}=R_1+R_2+R_3$, where $R_j$ is either $R_{pj}$ or $R_{apj}$ depending on whether the junction $MTJ_j$ is in its parallel or antiparallel state. In one embodiment, all junction resistances may be different. As used herein, with "different junction resistances" refers to that the various parallel and antiparallel states of the MTJs results in at least all combined total resistances ($R_{tot}=R_1+R_2+R_3$, see Table 1) being different. It may be assumed that a particular antiparallel resistance value $R_{api}$ follows the relation $R_{api}=R_{pi}(1+TMR)$, where TMR is the relative resistance change (i.e. effect amplitude). Changing the CD of a particular MTJ will change its corresponding $R_{pi}$, thereby further changing $R_{api}$ (assuming the TMR is kept more or less constant). TMR may for example be between 1.5 to 6. Even with a TMR in the lower end of such a spectrum, the series connection of the MTJs may allow to still distinguish between the different combined total resistances (and corresponding bit states). In one embodiment, the various junction resistances correspond to the binary number system. Phrased differently, it may be assumed that the CDs of the various MTJs may be made exponentially different, or at least almost exponentially different. For example, the first MTJ may correspond to a least significant bit, and the first MTJ being in its parallel state may correspond to the bit being a "0", while the first MTJ being in its antiparallel state may correspond to the bit being a "1". In the same way, the second MTJ may correspond to the next bit, and the third MTJ may correspond to the most significant bit, resulting in a total of three bits stored among the three MTJs. Written differently, the bit state of the three MTJs may be written as "$b_3b_2b_1$", where $b_j$ is "0" if the resistance of the j:th MTJ equals $R_{pj}$, and where $b_j$ is "1" if the resistance of the j:th MTJ instead equals $R_{apj}$. In alternative embodiments, the first MTJ corresponds to the most significant bit, and the third MTJ corresponds to the least significant bit (as illustrated in Table 2), etc. In alternative embodiments, an antiparallel state of a certain MTJ corresponds to the bit stored in that MTJ being a "0", and a parallel state of the certain MTJ corresponds to the bit stored in that MTJ being a "1". Various examples of how the MTJs and the total series resistance may correspond to various bit states are provided in Table 2.

TABLE 2

Junction resistance combinations and corresponding (binary) values for three MTJs.

| $R_1$ | $R_2$ | $R_3$ | $R_{tot}$ | Value | Binary | Value2 | Binary2 |
|---|---|---|---|---|---|---|---|
| $R_{p1}$ | $R_{p2}$ | $R_{p3}$ | $R_{p1}+R_{p2}+R_{p3}$ | 0 | 000 | 7 | 111 |
| $R_{p1}$ | $R_{p2}$ | $R_{ap3}$ | $R_{p1}+R_{p2}+R_{ap3}$ | 1 | 001 | 6 | 110 |
| $R_{p1}$ | $R_{ap2}$ | $R_{p3}$ | $R_{p1}+R_{ap2}+R_{p3}$ | 2 | 010 | 5 | 101 |
| $R_{p1}$ | $R_{ap2}$ | $R_{ap3}$ | $R_{p1}+R_{ap2}+R_{ap3}$ | 3 | 011 | 4 | 100 |
| $R_{ap1}$ | $R_{p2}$ | $R_{p3}$ | $R_{ap1}+R_{p2}+R_{p3}$ | 4 | 100 | 3 | 011 |
| $R_{ap1}$ | $R_{p2}$ | $R_{ap3}$ | $R_{ap1}+R_{p2}+R_{ap3}$ | 5 | 101 | 2 | 010 |
| $R_{ap1}$ | $R_{ap2}$ | $R_{p3}$ | $R_{ap1}+R_{ap2}+R_{p3}$ | 6 | 110 | 1 | 001 |
| $R_{ap1}$ | $R_{ap2}$ | $R_{ap3}$ | $R_{ap1}+R_{ap2}+R_{ap3}$ | 7 | 111 | 0 | 000 |

As will be described later, the addition of further MTJs and further SOT tracks may increase the range of storable values in the cell 100.

In another embodiment, all junction resistances may be equal, such that $R_{p1}=R_{p2}=R_{p3}=R$, and $R_{ap1}=R_{ap2}=R_{ap3}=R'$. Instead of storing a value using a binary representation, a value can then instead be stored by mapping the value to the number of junctions being in, e.g., its parallel state. For example, storing the value "3" may equal putting all the junctions in their antiparallel states, while storing, e.g., the value "1" may equal putting only one of the junctions in its antiparallel state. Phrased differently, exactly which of the junctions that are either in their parallel or antiparallel states is not important, as only the total number of junctions which are in their parallel states matters. For example, for three junctions, any value between (and including) 0 and 3 may be stored. This is illustrated in Table 3.

TABLE 3

Another example of junction resistance combinations and corresponding values for three MTJs.

| $R_1$ | $R_2$ | $R_3$ | $R_{tot}$ | Value |
|---|---|---|---|---|
| R | R | R | 3R | 0 |
| R | R | R' | 2R + R' | 1 |
| R | R' | R | 2R + R' | 1 |
| R | R' | R' | R + 2R' | 2 |
| R' | R' | R | R + 2R' | 2 |
| R' | R | R' | R + 2R' | 2 |
| R' | R' | R | R + 2R' | 2 |
| R' | R' | R' | 3R' | 3 |

Other ways of storing a value in the multibit memory cell 100 may be used than those described above. For example, which junction that represents the most significant bit or the least significant bit may be changed, or the specific weight given to each junction (by tailoring its junction resistance) may be varied.

Figure 1D:
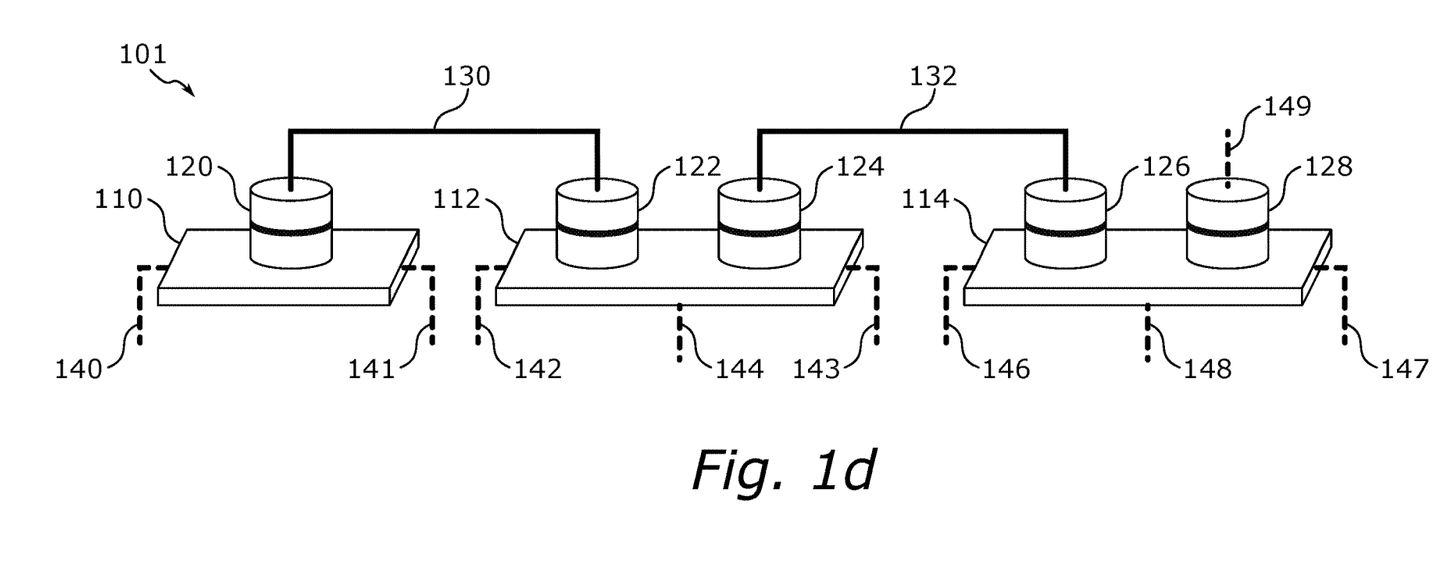
FIG. 1D illustrates schematically a further embodiment of a multibit memory cell according to the disclosed technology.

The number of junctions may further be increased. FIG. 1D illustrates schematically an embodiment of a multibit memory cell (i.e. a "cell") 101, wherein a further third SOT track 114 is provided along with a fourth MTJ 126 and a fifth MTJ 128. The third SOT track 114 is separate from the first SOT track 110 and the second SOT track 112. The fourth MTJ 126 and the fifth MTJ 128 are both provided on the third SOT track 114. The cell 101 includes a further, second electrically conductive path 132 which connects the third MTJ 124 and the fourth MTJ 126 together. As described earlier, depending on whether two MTJs should be written to simultaneously using a same SOT write current, or written to individually using two different SOT write currents, or whether the third MTJ 126 should be written to using an SOT write current and the fifth MTJ 128 be written to using an STT write current, the cell 101 may include different configurations of further terminals 146, 147, 148, and 149 (of which some may be optional, depending on the exact desired write currents) connected to the third SOT track 114. To read the combined multibit state of the cell 101, a read current (not shown in FIG. 1D) may be injected through all of the first MTJ 120, the electrically conductive path 130, the second MTJ 122, the third MTJ 124, the second electrically conductive path 132, the fourth MTJ 126 and the fifth MTJ 128. The principle of operating the cell 101 is thus the same as that for the cell 100 described with reference to FIGS. 1A to 1C, but with an additional number of MTJs and thus an additional number of storable values. In some embodiments, even further number of MTJs and SOT tracks may be provided, as long as all MTJs may be series connected with the help of various electrically conductive paths and SOT tracks as described herein.

In some embodiments, the various multibit memory cells as described herein may be further provided with various switches (e.g., transistors) connected to the various terminals in order to, in a controlled way, inject the various SOT (and possibly STT) write currents and to inject the necessary read current(s). Further, such switches may be connected accordingly to various lines in a memory array in which the multibit memory cell may form part. Such various lines may for example include bit-lines, word-lines, read/write-lines, etc. Using the cell 100 as illustrated in FIG. 1A as an example, the terminal 140 may be connected to one leg of a switch (such as a drain of a transistor), and that the other leg of the switch (such as a source of the transistor) is connected to a bit-line. The control terminal (such as a gate of the transistor) may in turn be connected to a read/write-line. Similarly, the terminal 141 may be connected to one leg of another switch (such as a drain of another transistor), and the other leg of the other switch (such as a source of the other transistor) may be connected to a bit-line-bar. The control terminal of the other switch (such as a gate of the other transistor) may in turn be connected to a word-line. Thus, in order to for example inject an SOT write current from the terminal 140 to the terminal 141, the bit-line may be pulled high to for example a VDD voltage (and the bit-line-bar be pulled low to for example a VSS voltage. By pulling both the read/write-line and the word-line high, the switches (transistors) connected to the terminals 140 and 141 may both be opened (i.e. put in a conducting state), such that current may flow from the high bit-line, into the terminal 140, through the first SOT track 110, and out through the terminal 141 and out into the bit-line-bar. To put the first MTJ into a different state, the bit-line may instead be pulled low (e.g., to a VSS voltage) and the bit-line-bar may be pulled high (e.g., to a VDD voltage). This would reverse the direction of the injected current, and thereby alter the state of the first MTJ 120. In some embodiments, similar arrangement of transistors and operations of the various control lines may be used to provide wanted SOT/STT write currents to the remaining MTJs, and to inject the wanted read current through all the series connected MTJs.

The person skilled in the art realizes that the present disclosure is by no means limited to the embodiments described above. On the contrary, many modifications and variations are possible within the scope of the appended claims.

Although features and elements are described above in particular combinations, each feature or element may be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

What is claimed is:

1. A multibit memory cell, comprising:
   a plurality of spin-orbit torque (SOT) tracks, comprising: a first SOT track, and a second SOT track separate from the first SOT track;
   a plurality of magnetic tunnel junctions (MTJs) connected in series, comprising: a first MTJ arranged on the first SOT track such that a magnetic free layer of the first MTJ is connected to the first SOT track, and a second MTJ and a third MTJ both arranged on the second SOT track such that magnetic free layers of the second MTJ and the third MTJ are both connected to the second SOT track;
   an electrically conductive path operably connecting magnetic reference layers of the first MTJ and the second MTJ; and
   a plurality of terminals configured to provide:
      to the first MTJ, a first SOT write current flowing in the first SOT track;
      to the second MTJ, a second SOT write current flowing in the second SOT track; and
      to the third MTJ, one selected from the group consisting of the second SOT write current flowing in the second SOT track, a third SOT write current flowing in the second SOT track, and a spin transfer torque (STT) write current flowing through the third MTJ,
   wherein respective junction resistances of the plurality of MTJs are configured such that a combined multibit memory state of the plurality of MTJs is readable by a read current passing through all of the plurality of MTJs connected in series via the electrically conductive path.

2. The multibit memory cell according to claim 1, wherein the plurality of SOT tracks further comprises a third SOT track separate from both the first SOT track and the second SOT track, wherein the plurality of MTJs further comprises a fourth MTJ and a fifth MTJ arranged on the third SOT track, and wherein the multibit memory cell further comprises:
   a second electrically conductive path operably connecting the third MTJ and the fourth MTJ; and
   further terminals configured to provide:
      to the fourth MTJ, a fourth SOT write current flowing in the third SOT track; and
      to the fifth MTJ, one selected from the group consisting of the fourth SOT write current flowing in the third SOT track, a fifth SOT write current flowing in the third SOT track, and a second STT write current flowing through the fifth MTJ,
   wherein respective junction resistances of the plurality of MTJs are configured such that a combined multibit memory state of the plurality of MTJs is readable by a read current through all of the plurality of MTJs in series via the electrically conductive path and the second electrically conductive path.

3. The multibit memory cell according to claim 1, wherein the junction resistances of the plurality of MTJs are all different.

4. The multibit memory cell according to claim 3, wherein the junction resistances of the plurality of MTJs are each selected as a constant value times a different power of two.

5. The multibit memory cell according to claim 1, wherein the junction resistances of the plurality of MTJs are all equal.

6. The multibit memory cell according to claim 2, wherein the junction resistances of the plurality of MTJs are all equal.

7. The multibit memory cell according to claim 2, wherein the junction resistances of the plurality of MTJs are all different.

8. The multibit memory cell according to claim 7, wherein the junction resistances of the plurality of MTJs are each selected as a constant value times a different power of two.

9. The multibit memory cell according to claim 3, wherein the different junction resistances of the plurality of MTJs are achieved by varying the critical dimension of each MTJ.

10. The multibit memory cell according to claim 4, wherein an exponential difference in junction resistance between different MTJs is achieved by varying the critical dimension of each MTJ exponentially.

11. The multibit memory cell according to claim 7, wherein the different junction resistances of the plurality of MTJs are achieved by varying the critical dimension of each MTJ.

12. The multibit memory cell according to claim 8, wherein an exponential difference in junction resistance between different MTJs is achieved by varying the critical dimension of each MTJ exponentially.

13. The multibit memory cell according to claim 1, wherein each MTJ comprises a magnetic free layer and a magnetic reference layer separated by a barrier layer.

14. The multibit memory cell according to claim 13, wherein the magnetic free layer and the magnetic reference layer are formed of ferromagnetic materials, and wherein the barrier layer is formed of a non-magnetic material.

15. The multibit memory cell according to claim 13, wherein each MTJ is oriented such that the magnetic free layer is connected to the respective SOT track.

16. The multibit memory cell according to claim 13, wherein the junction resistance of each MTJ is lower when the magnetic free layer and the magnetic reference layer are in a parallel state compared to when the magnetic free layer and the magnetic reference layer are in a non-parallel state.

17. The multibit memory cell according to claim 16, wherein the parallel state is associated with logic "1", and wherein the non-parallel state is associated with logic "0".

18. The multibit memory cell according to claim 13, wherein the electrically conductive path extends between the magnetic reference layers of the first and the second MTJs.

19. The multibit memory cell according to claim 13, wherein the first SOT write current flows at least in proximity of the magnetic free layer of the first MTJ, and wherein the second SOT write current flows at least in proximity of the magnetic free layer of the second MTJ.

20. The multibit memory cell according to claim 1, wherein each SOT track comprises at least one layer of an electrically conducting material exhibiting spin-orbit coupling, and wherein the SOT track is formed of a metal, a topological insulator, a transition metal dichalcogenide, or any combination thereof.

* * * * *

UNITED STATES PATENT AND TRADEMARK OFFICE
CERTIFICATE OF CORRECTION

PATENT NO. : 11,527,709 B2
APPLICATION NO. : 17/027525
DATED : December 13, 2022
INVENTOR(S) : Mohit Gupta et al.

It is certified that error appears in the above-identified patent and that said Letters Patent is hereby corrected as shown below:

In the Specification

Column 3, Line 33, delete "$R_3$" and insert -- $R_j$ --.

Column 3, Line 35, delete "$R_3$" and insert -- $R_j$ --.

Column 3, Line 37, delete "$R_3$" and insert -- $R_j$ --.

Signed and Sealed this
Fourth Day of April, 2023

Katherine Kelly Vidal
*Director of the United States Patent and Trademark Office*